(12) United States Patent
Kuan et al.

(10) Patent No.: US 7,709,944 B2
(45) Date of Patent: May 4, 2010

(54) INTEGRATED CIRCUIT PACKAGE SYSTEM WITH PACKAGE INTEGRATION

(75) Inventors: Heap Hoe Kuan, Singapore (SG); Seng Guan Chow, Singapore (SG); Linda Pei Ee Chua, Singapore (SG); Dioscoro A. Merilo, Singapore (SG)

(73) Assignee: STATS ChipPac Ltd., Singapore (SG)

( * ) Notice: Subject to any disclaimer, the term of this patent is extended or adjusted under 35 U.S.C. 154(b) by 111 days.

(21) Appl. No.: 11/958,838

(22) Filed: Dec. 18, 2007

(65) Prior Publication Data

US 2009/0152701 A1 Jun. 18, 2009

(51) Int. Cl.
*H01L 23/02* (2006.01)

(52) U.S. Cl. ............... 257/686; 257/724; 257/E25.031; 257/E23.042

(58) Field of Classification Search ......... 257/678–733, 257/685, 686, 723, 726, E23.031–E23.032, 257/E23.042, 787–796, E23.001–E23.194
See application file for complete search history.

(56) References Cited

U.S. PATENT DOCUMENTS

| 7,163,842 | B2 | 1/2007 | Karnezos |
| 2005/0230799 | A1 | 10/2005 | Kang |
| 2006/0065972 | A1* | 3/2006 | Khan et al. ................. 257/712 |
| 2006/0220256 | A1* | 10/2006 | Shim et al. ................. 257/777 |
| 2006/0244157 | A1 | 11/2006 | Carson |
| 2006/0267175 | A1* | 11/2006 | Lee ............................ 257/686 |

* cited by examiner

*Primary Examiner*—Fernando L Toledo
*Assistant Examiner*—Mamadou Diallo
(74) *Attorney, Agent, or Firm*—Mikio Ishimaru

(57) ABSTRACT

An integrated circuit package system comprising: providing a package substrate; attaching a base package having a portion of the base package substantially exposed over the package substrate; forming a cavity through the package substrate to the base package; and attaching a device partially in the cavity and connected to the portion of the base package substantially exposed.

22 Claims, 4 Drawing Sheets

INTEGRATED CIRCUIT PACKAGE SYSTEM WITH PACKAGE INTEGRATION

TECHNICAL FIELD

The present invention relates generally to integrated circuit packages and more particularly to a system for integrated circuit packages with package-in-package.

BACKGROUND ART

With virtually all functions and purposes for which we use electronic products, there continues to be demand for new features, higher speed, larger data, or improved portability. These demands continually drive the electronics industry to reduce size, improve utility, and increase performance of integrated circuit devices contained within these products to which we have become accustomed.

Electronic products have become such an integral part of our daily lives. Notably, many portable electronics with complex integrated circuits are not only common but also used without the slightest thought about the underlying technology. Many products such as cell phones, portable computers, voice recorders, cars, planes, etc. include very sophisticated electronic technology to which we have become accustomed.

There has been constant pressure within the semiconductor industry to reduce dimensional footprints as well as increase quality, reliability, and performance fueled by consumer demands for smaller, higher quality computers and electronic devices that operate faster, with more information, and more reliably under broader operating conditions and environments.

The smaller and smaller integrated circuits are commonly assembled into integrated circuit packages for protection and interconnection to other integrated circuits, integrated circuit packages, printed circuit boards, or other subsystems. The development of integrated circuit packages requires not only compatibility with a wide range of integrated circuits but can also provide integration or combinations not available to a single integrated circuit device.

Many electronic products have taken advantage of including multiple integrated circuit devices or integrated circuit packages within a larger integrated circuit package. The larger integrated circuit package provides protection from operating conditions, intraconnection between components, and interconnection to a next level subsystem. Modular components can also reduce defects lowering overall costs of the integrated circuit package.

While stacking integrated circuits within integrated circuit packages has improved dimensional densities and footprints it has not been without problems. Integrated circuit and integrated circuit package component dimensions have been limited and restricted by manufacturing methods and equipment. Component features and performance are all too often compromised by the restrictive limits of the available space.

Attempts to provide additional space for multiple components have also suffered from poor connectivity between the integrated circuits and integrated circuit packages within the larger package. Attempting to alleviate limited and restricted connectivity has commonly resulted in increasing size and complexity.

Despite the advantages of recent developments in integrated circuit and integrated circuit package manufacturing, there is a continuing need for improving integrated circuit device and integrated circuit package connectivity and stacking to provide improved dimensional size of available space and as well as structural integrity, manufacturing yield, and product reliability.

Thus, a need still remains for an integrated circuit package system to provide improved package-in-package stacking integration. In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a package substrate; attaching a base package having a portion of the base package substantially exposed over the package substrate; forming a cavity through the package substrate to the base package; and attaching a device partially in the cavity and connected to the portion of the base package substantially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
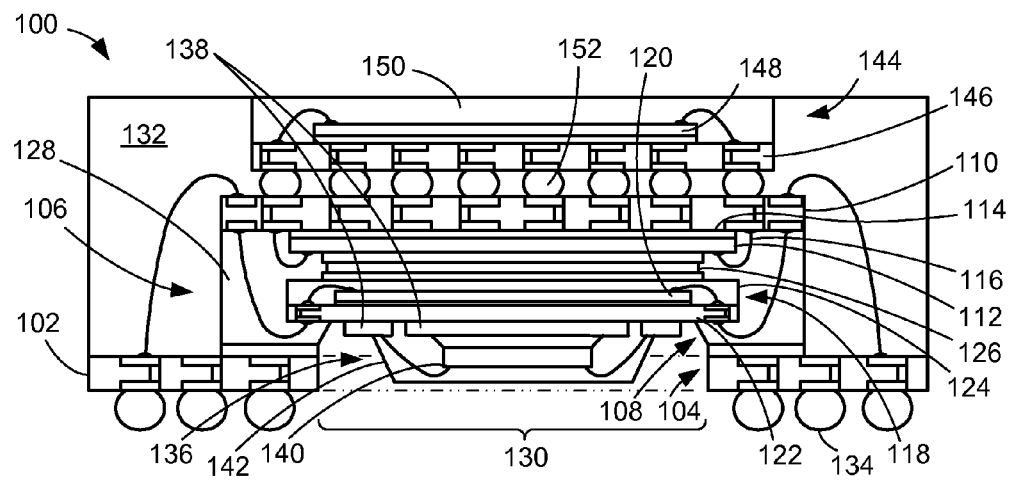
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
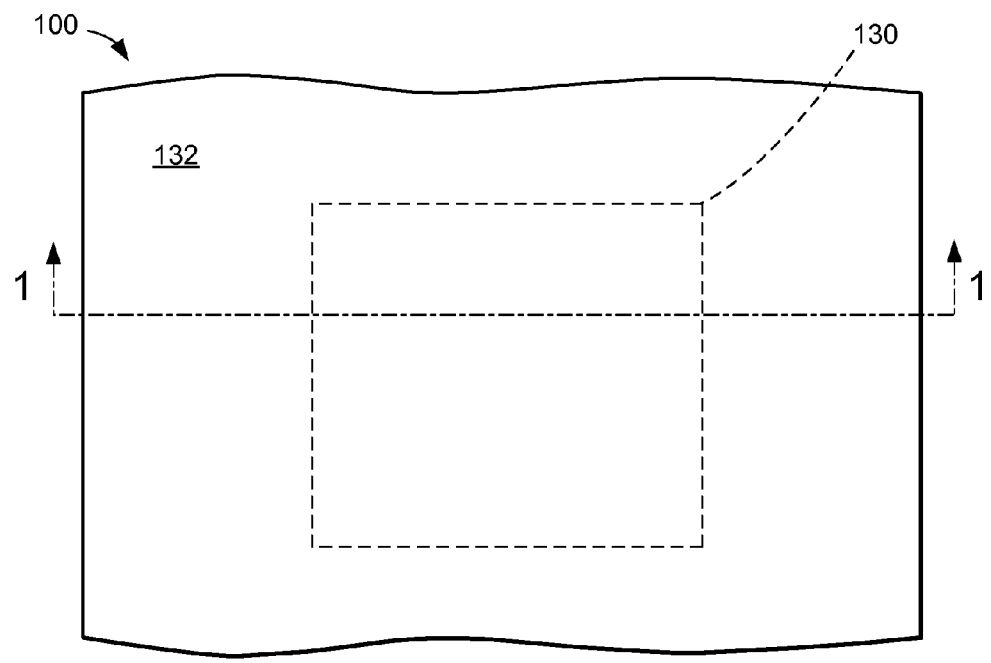
FIG. 2 is a top plan view of the integrated circuit package system.

Referring now to FIG. 1, therein is shown a cross-sectional view of an integrated circuit package system 100 taken along line 1-1 of FIG. 2 in a first embodiment of the present invention. The integrated circuit package system 100 preferably includes a package substrate 102 having a package substrate opening 104. A base package 106 such as an encapsulant cavity package having a base package cavity 108 can be attached or mounted over the package substrate 102.

The base package 106 can preferably include a first package substrate 110 whereon a first package die 112 can be attached or mounted with an attach layer 114. The attach layer 114 can be formed of a material such as an adhesive, epoxy, film, or combination thereof. Further the attach layer 114 provides adhesion, positioning, or structural integrity as well as conductivity or isolation. The attach layer 114 can be formed over any component and include a same material, a different material, or combination thereof.

The first package die 112 can be electrically connected to the first package substrate 110 with connectors 116 such as bond wires, planar interconnect, tab bonds, any conductor, or combination thereof. The connectors 116 can provide electrical connectivity for any component or combination of components including die or substrates.

A base inner package 118 or internal stack module can preferably include a second package die 120 attached or mounted with the attach layer 114 over a second package substrate 122 such as an interposer or multi-layer substrate. The second package die 120 can be electrically connected to the second package substrate 122 with the connectors 116. A base inner package encapsulant 124 can be formed over the second package die 120, the second package substrate 122, and the connectors 116.

The base inner package encapsulant 124 can be attached or mounted over the first package die 112, providing a side of the second package substrate 122 opposite the second package die 120 substantially exposed. Optionally a spacer 126 can be mounted over the first package die 112 with the attach layer 114 whereover the base inner package 118 or internal stack module can be attached or mounted with the attach layer 114. The connectors 116 can connect the second package substrate 122 and the first package substrate 110 thereby connecting the second package die 120 with the first package die 112 or a next level system.

A base package encapsulant 128 can be applied over the base inner package 118 or internal stack module, the first package die 112, the first package substrate 110, the connectors 116, or optionally the spacer 126. The base package encapsulant 128 can be formed providing the side of the second package substrate 122 opposite the second package die 120 substantially exposed.

The base package encapsulant 128 can be formed having orthogonal or non-orthogonal sides. For example, while all sides can be formed orthogonally, the base package cavity 108 can be formed having tapered or angled sides of the base package cavity 108 having an opening with planar dimensions greater than planar dimensions of a closed end. The base package cavity 108 can be formed in the base package encapsulant 128 over a portion of the second package substrate 122 for providing the second package substrate 122 substantially exposed for connectivity to other components.

The base package 106 can be attached over the package substrate 102 wherein the base package cavity 108 can be substantially aligned to the package substrate opening 104 to form a cavity 130 such as a fan-in cavity. The cavity 130 can be formed by the base package cavity 108, the package substrate opening 104, and the second package substrate 122 of the base package 106. The second package substrate 122 can provide a mounting or contact surface for another device.

A package encapsulant 132 can be applied over the base package 106, and the package substrate 102 having the package substrate opening 104. Package connectors 134 such as solder bumps, solder balls, any conductor, or combination thereof can be formed over the package substrate 102 on a side opposite the base package 106. The package connectors 134 can provide electrically connectivity to a next level system such as another package, a printed circuit board, any subsystem, or combination thereof.

A stack package 136 such as an external quad flat no-lead or land grid array can be mounted over the second package substrate 122 and partially within the cavity 130. The stack package 136 can include a stack package base 138 such as a leadframe or multilayer substrate wherein a stack package die 140 can be attached or mounted over the stack package base 138 with the attach layer 114.

The connectors 116 can electrically connect the stack package die 140 and the stack package base 138 thereby connecting the stack package die 140 to the base package 106. A stack package encapsulant 142 can be applied over the stack package die 140, the connectors 116, or the stack package base 138 for protection or structural integrity.

Optionally a top package 144 can be attached or mounted over the first package substrate 110 on a side opposite the first package die 112. The top package 144 can include a top package substrate 146, a top package die 148 such as a flip-chip or wirebond die attached or mounted over the top package substrate 146, a top package encapsulant 150 over the top package die 148 and the top package substrate 146. The top package die 148 over the top package substrate 146 can be attached with the attach layer 114 or electrically connected with the connectors 116.

Top package connectors 152 can be formed over the top package substrate 146 on a side opposite the top package die 148. The top package connectors 152 can provide electrical connectivity to the first package substrate 110 and thereby the package substrate 102. The package encapsulant 132 can optionally be formed over the top package 144 as well as the base package 106 having the base package cavity 108 and the package substrate 102 having the package substrate opening 104. The connectors 116 such as wire interconnect can connect the first package substrate 110 to the package substrate 102.

It has been discovered that the integrated circuit package system 100 with the cavity 130 can include the base package 106 such as an encapsulant cavity package and allow further stacking of another package such as the stack package 136 partially in the cavity 130. Further, the integrated circuit package system 100 allows stacking of another package such as the top package 144 over a top side of the base package 106.

Referring now to FIG. 2 therein is shown a top plan view of the integrated circuit package system 100. The integrated circuit package system 100 preferably includes the package encapsulant 132 over the cavity 130 having the base package cavity 108 of FIG. 1 substantially aligned to the package substrate opening 104 of FIG. 1. The cavity 130 allows further stacking of additional packages over a package-in-package configuration.

The integrated circuit package system 100 having the base package 106 of FIG. 1 and optionally the top package 144 of FIG. 1 can be formed with a configuration of a package-in-package. The cavity 130 of the base package 106 of FIG. 1 and the base inner package 118 or internal stack module of FIG. 1 can be formed with a configuration of a fan-in internal-stack-module providing stacking of packages in addition to the package-in-package devices or components.

For illustrative purposes, the cavity 130 is shown in a shape of a rectangle having a substantially square shape although it is understood that the cavity 130 may be of any shape or size.

Figure 3:
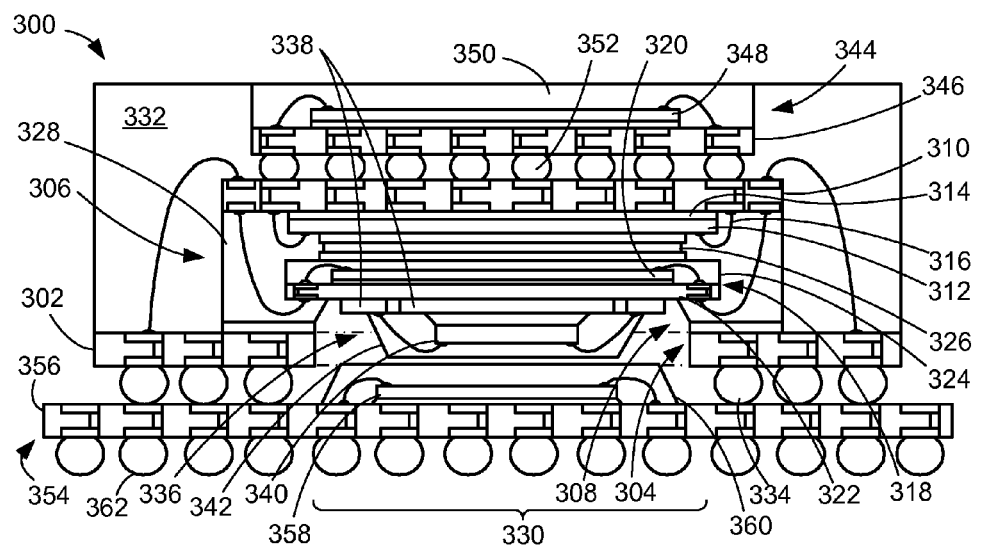
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes a package substrate 302 having a package substrate opening 304. A base package 306 such as an encapsulant cavity package having a base package cavity 308 can be attached or mounted over the package substrate 302.

The base package 306 can preferably include a first package substrate 310 whereon a first package die 312 can be attached or mounted with an attach layer 314. The attach layer 314 can be formed of a material such as an adhesive, epoxy, film, or combination thereof. Further the attach layer 314 provides adhesion, positioning, or structural integrity as well as conductivity or isolation. The attach layer 314 can be formed over any component and include a same material, a different material, or combination thereof.

The first package die 312 can be electrically connected to the first package substrate 310 with connectors 316 such as bond wires, planar interconnect, tab bonds, any conductor, or combination thereof. The connectors 316 can provide electrical connectivity for any component or combination of components including die or substrates.

A base inner package 318 or internal stack module can preferably include a second package die 320 attached or mounted with the attach layer 314 over a second package substrate 322 such as an interposer or multi-layer substrate. The second package die 320 can be electrically connected to the second package substrate 322 with the connectors 316. A base inner package encapsulant 324 can be formed over the second package die 320, the second package substrate 322, and the connectors 316.

The base inner package encapsulant 324 can be attached or mounted over the first package die 312, providing a side of the second package substrate 322 opposite the second package die 320 substantially exposed. Optionally a spacer 326 can be mounted over the first package die 312 with the attach layer 314 whereover the base inner package 318 or internal stack module can be attached or mounted with the attach layer 314. The connectors 316 can connect the second package substrate 322 and the first package substrate 310 thereby connecting the second package die 320 with the first package die 312 or a next level system.

A base package encapsulant 328 can be applied over the base inner package 318 or internal stack module, the first package die 312, the first package substrate 310, the connectors 316, or optionally the spacer 326. The base package encapsulant 328 can be formed providing the side of the second package substrate 322 opposite the second package die 320 substantially exposed.

The base package encapsulant 328 can be formed having orthogonal or non-orthogonal sides. For example, while all sides can be formed orthogonally, the base package cavity 308 can be formed having tapered or angled sides of the base package cavity 308 having an opening with planar dimensions greater than planar dimensions of a closed end. The base package cavity 308 can be formed in the base package encapsulant 328 over a portion of the second package substrate 322 for providing the second package substrate 322 substantially exposed for connectivity to other components.

The base package 306 can be attached over the package substrate 302 wherein the base package cavity 308 can be substantially aligned to the package substrate opening 304 to form a cavity 330. The cavity 330 can be formed by the base package cavity 308, the package substrate opening 304, and the second package substrate 322 of the base package 306. The second package substrate 322 can provide a mounting or contact surface for another device.

A package encapsulant 332 can be applied over the base package 306, and the package substrate 302 having the package substrate opening 304. Package connectors 334 such as solder bumps, solder balls, any conductor, or combination thereof can be formed over the package substrate 302 on a side opposite the base package 306. The package connectors 334 can provide electrically connectivity to a next level system such as another package, a printed circuit board, any subsystem, or combination thereof.

A stack package 336 such as an external quad flat no-lead or land grid array can be mounted over the second package substrate 322 and partially within the cavity 330. The stack package 336 can include a stack package base 338 such as a leadframe or multilayer substrate wherein a stack package die 340 can be attached or mounted over the stack package base 338 with the attach layer 314.

The connectors 316 can electrically connect the stack package die 340 and the stack package base 338 thereby connecting the stack package die 340 to the base package 306. A stack package encapsulant 342 can be applied over the stack package die 340, the connectors 316, or the stack package base 338 for protection or structural integrity.

Optionally a top package 344 can be attached or mounted over the first package substrate 310 on a side opposite the first package die 312. The top package 344 can include a top package substrate 346, a top package die 348 such as a flip-chip or wirebond die attached or mounted over the top package substrate 346, a top package encapsulant 350 over the top package die 348 and the top package substrate 346. The top package die 348 over the top package substrate 346 can be attached with the attach layer 314 or electrically connected with the connectors 316.

Top package connectors 352 can be formed over the top package substrate 346 on a side opposite the top package die 348. The top package connectors 352 can provide electrical connectivity to the first package substrate 310 and thereby the package substrate 302. The package encapsulant 332 can optionally be formed over the top package 344 as well as the base package 306 having the base package cavity 308 and the package substrate 302 having the package substrate opening 304.

The package substrate 302 having the package connectors 334 can be attached or mounted over a bottom package 354 having a bottom package substrate 356, a bottom package die 358, a bottom package encapsulant 360, and bottom package connectors 362. The bottom package die 358 over the bottom package substrate 356 can be attached or mounted with the attach layer 314 and can be electrically connected with the connectors 316.

The bottom package encapsulant 360 can be applied over the bottom package die 358, the connectors 316, and the bottom package substrate 356 for protection or structural integrity. The bottom package connectors 362 can be formed over the bottom package substrate 356 on a side opposite the bottom package die 358 for electrically connectivity to a next level system such as another package, a printed circuit board, any subsystem, or combination thereof.

A portion of the bottom package encapsulant 360 can protrude into the cavity 330 to provide a lower height or profile of the integrated circuit package system 300. The package connectors 334 can be connected to the bottom package substrate 356 thereby providing electrical connectivity through the bottom package substrate 356 and the bottom package connectors 362 to the next level system.

It has been discovered that the integrated circuit package system 300 with the cavity 330 allows further stacking over a bottom package to form a package-on-package (PoP).

Figure 4:
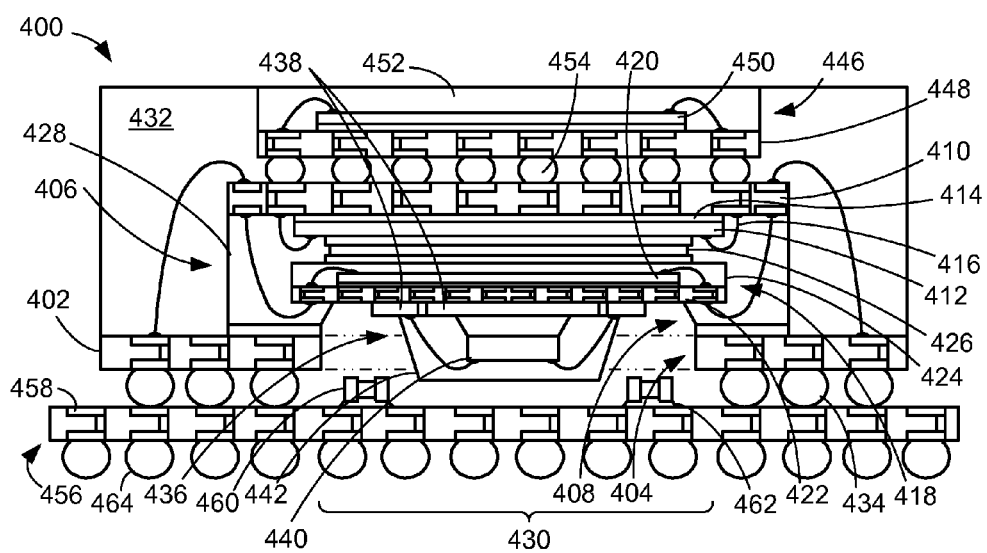
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes a package substrate 402 having a package substrate opening 404. A base package 406 such as an encapsulant cavity package having a base package cavity 408 can be attached or mounted over the package substrate 402.

The base package 406 can preferably include a first package substrate 410 whereon a first package die 412 can be attached or mounted with an attach layer 414. The attach layer 414 can be formed of a material such as an adhesive, epoxy, film, or combination thereof. Further the attach layer 414 provides adhesion, positioning, or structural integrity as well as conductivity or isolation. The attach layer 414 can be formed over any component and include a same material, a different material, or combination thereof.

The first package die 412 can be electrically connected to the first package substrate 410 with connectors 416 such as bond wires, planar interconnect, tab bonds, any conductor, or combination thereof. The connectors 416 can provide electrical connectivity for any component or combination of components including die or substrates.

A base inner package 418 or internal stack module can preferably include a second package die 420 attached or mounted with the attach layer 414 over a second package substrate 422 such as an interposer or multi-layer substrate. The second package die 420 can be electrically connected to the second package substrate 422 with the connectors 416. A base inner package encapsulant 424 can be formed over the second package die 420, the second package substrate 422, and the connectors 416.

The base inner package encapsulant 424 can be attached or mounted over the first package die 412, providing a side of the second package substrate 422 opposite the second package die 420 substantially exposed. Optionally a spacer 426 can be mounted over the first package die 412 with the attach layer 414 whereover the base inner package 418 or internal stack module can be attached or mounted with the attach layer 414. The connectors 416 can connect the second package substrate 422 and the first package substrate 410 thereby connecting the second package die 420 with the first package die 412 or a next level system.

A base package encapsulant 428 can be applied over the base inner package 418 or internal stack module, the first package die 412, the first package substrate 410, the connectors 416, or optionally the spacer 426. The base package encapsulant 428 can be formed providing the side of the second package substrate 422 opposite the second package die 420 substantially exposed.

The base package encapsulant 428 can be formed having orthogonal or non-orthogonal sides. For example, while all sides can be formed orthogonally, the base package cavity 408 can be formed having tapered or angled sides of the base package cavity 408 having an opening with planar dimensions greater than planar dimensions of a closed end. The base package cavity 408 can be formed in the base package encapsulant 428 over a portion of the second package substrate 422 for providing the second package substrate 422 substantially exposed for connectivity to other components.

The base package 406 can be attached over the package substrate 402 wherein the base package cavity 408 can be substantially aligned to the package substrate opening 404 to form a cavity 430. The cavity 430 can be formed by the base package cavity 408, the package substrate opening 404, and the second package substrate 422 of the base package 406. The second package substrate 422 can provide a mounting or contact surface for another device.

A package encapsulant 432 can be applied over the base package 406, and the package substrate 402 having the package substrate opening 404. Package connectors 434 such as solder bumps, solder balls, any conductor, or combination thereof can be formed over the package substrate 402 on a side opposite the base package 406. The package connectors 434 can provide electrically connectivity to a next level system such as another package, a printed circuit board, any subsystem, or combination thereof.

A stack package 436 such as an external quad flat no-lead or land grid array can be mounted over the second package substrate 422 and partially within the cavity 430. The stack package 436 can include a stack package base 438 such as a leadframe or multilayer substrate wherein a stack package die 440 can be attached or mounted over the stack package base 438 with the attach layer 414.

The connectors 416 can electrically connect the stack package die 440 and the stack package base 438 thereby connecting the stack package die 440 to the base package 406. A stack package encapsulant 442 can be applied over the stack package die 440, the connectors 416, or the stack package base 438 for protection or structural integrity.

Optionally a top package 446 can be attached or mounted over the first package substrate 410 on a side opposite the first package die 412. The top package 446 can include a top package substrate 448, a top package die 450 such as a flip-chip or wirebond die attached or mounted over the top package substrate 448, a top package encapsulant 452 over the top package die 450 and the top package substrate 448. The top package die 450 over the top package substrate 448 can be attached with the attach layer 414 or electrically connected with the connectors 416.

Top package connectors 454 can be formed over the top package substrate 448 on a side opposite the top package die 450. The top package connectors 454 can provide electrical connectivity to the first package substrate 410 and thereby the package substrate 402. The package encapsulant 432 can optionally be formed over the top package 446 as well as the base package 406 having the base package cavity 408 and the package substrate 402 having the package substrate opening 404.

The package substrate 402 having the package connectors 434 can be attached or mounted over an interposer 456 having interposer conductors 458. Components 460 such as passive components can be mounted over the interposer 456 with a component attach layer 462 such as solder paste or a conductive material. Interposer connectors 464 can be formed over the interposer 456 on a side opposite the components 460 for electrically connectivity to a next level system such as another package, a printed circuit board, any subsystem, or combination thereof.

A portion of the components 460 can protrude into the cavity 430 to provide a lower height or profile of the integrated circuit package system 400. The package connectors 434 can be connected to the interposer 456 thereby providing electrical connectivity through the interposer 456 and the interposer connectors 464 to the next level system.

It has been discovered that the integrated circuit package system 400 with the cavity 430 allows further stacking over an interposer to form a package-on-package.

Figure 5:
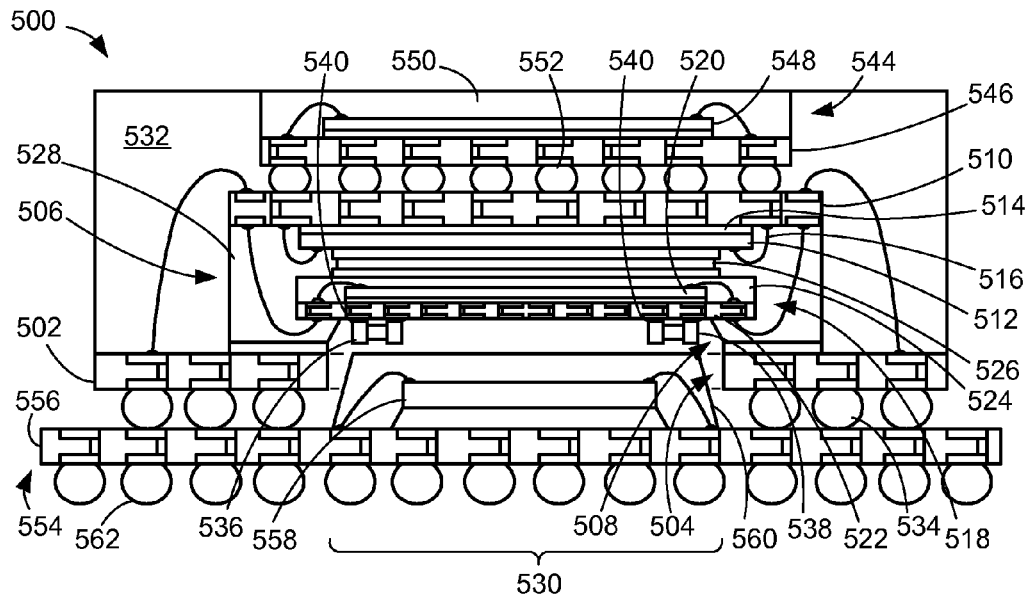
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 preferably includes a package substrate 502 having a package substrate opening 504. A base package 506 such as an encapsulant cavity package having a base package cavity 508 can be attached or mounted over the package substrate 502.

The base package 506 can preferably include a first package substrate 510 whereon a first package die 512 can be attached or mounted with an attach layer 514. The attach layer 514 can be formed of a material such as an adhesive, epoxy, film, or combination thereof. Further the attach layer 514 provides adhesion, positioning, or structural integrity as well as conductivity or isolation. The attach layer 514 can be formed over any component and include a same material, a different material, or combination thereof.

The first package die 512 can be electrically connected to the first package substrate 510 with connectors 516 such as bond wires, planar interconnect, tab bonds, any conductor, or combination thereof. The connectors 516 can provide electrical connectivity for any component or combination of components including die or substrates.

A base inner package 518 or internal stack module can preferably include a second package die 520 attached or mounted with the attach layer 514 over a second package substrate 522 such as an interposer or multi-layer substrate. The second package die 520 can be electrically connected to the second package substrate 522 with the connectors 516. A base inner package encapsulant 524 can be formed over the second package die 520, the second package substrate 522, and the connectors 516.

The base inner package encapsulant 524 can be attached or mounted over the first package die 512, providing a side of the second package substrate 522 opposite the second package die 520 substantially exposed. Optionally a spacer 526 can be mounted over the first package die 512 with the attach layer 514 whereover the base inner package 518 or internal stack module can be attached or mounted with the attach layer 514. The connectors 516 can connect the second package substrate 522 and the first package substrate 510 thereby connecting the second package die 520 with the first package die 512 or a next level system.

A base package encapsulant 528 can be applied over the base inner package or internal stack module, the first package die 512, the first package substrate 510, the connectors 516, or optionally the spacer 526. The base package encapsulant 528 can be formed providing the side of the second package substrate 522 opposite the second package die 520 substantially exposed.

The base package encapsulant 528 can be formed having orthogonal or non-orthogonal sides. For example, while all sides can be formed orthogonally, the base package cavity 508 can be formed having tapered or angled sides of the base package cavity 508 having an opening with planar dimensions greater than planar dimensions of a closed end. The base package cavity 508 can be formed in the base package encapsulant 528 over a portion of the second package substrate 522 for providing the second package substrate 522 substantially exposed for connectivity to other components.

The base package 506 can be attached over the package substrate 502 wherein the base package cavity 508 can be substantially aligned to the package substrate opening 504 to form a cavity 530. The cavity 530 can be formed by the base package cavity 508, the package substrate opening 504, and the second package substrate 522 of the base package 506. The second package substrate 522 can provide a mounting or contact surface for another device.

A package encapsulant 532 can be applied over the base package 506, and the package substrate 502 having the package substrate opening 504. Package connectors 534 such as solder bumps, solder balls, any conductor, or combination thereof can be formed over the package substrate 502 on a side opposite the base package 506. The package connectors 534 can provide electrically connectivity to a next level system such as another package, a printed circuit board, any subsystem, or combination thereof.

A first component 536 such as a passive component or a second component 538 such as a passive component can be attached or mounted over the second package substrate 522 and substantially within the cavity 530. A component attach layer 540 such as solder paste or a conductive material can be applied over the second package substrate 522 on a side opposite the second package die 520 and over the first component 536 or the second component 538.

Optionally a top package 544 can be attached or mounted over the first package substrate 510 on a side opposite the first package die 512. The top package 544 can include a top package substrate 546, a top package die 548 such as a flip-chip or wirebond die attached or mounted over the top package substrate 546, a top package encapsulant 550 over the top package die 548 and the top package substrate 546. The top package die 548 over the top package substrate 546 can be attached with the attach layer 514 or electrically connected with the connectors 516.

Top package connectors 552 can be formed over the top package substrate 546 on a side opposite the top package die 548. The top package connectors 552 can provide electrical connectivity to the first package substrate 510 and thereby the package substrate 502. The package encapsulant 532 can optionally be formed over the top package 544 as well as the base package 506 having the base package cavity 508 and the package substrate 502 having the package substrate opening 504.

The package substrate 502 having the package connectors 534 can be attached or mounted over a bottom package 554 having a bottom package substrate 556, a bottom package die 558, a bottom package encapsulant 560, and bottom package connectors 562. The bottom package die 558 over the bottom package substrate 556 can be attached or mounted with the attach layer 514 and can be electrically connected with the connectors 516.

The bottom package encapsulant 560 can be applied over the bottom package die 558, the connectors 516, and the bottom package substrate 556 for protection or structural integrity. The bottom package connectors 562 can be formed over the bottom package substrate 556 on a side opposite the bottom package die 558 for electrically connectivity to a next level system such as another package, a printed circuit board, any subsystem, or combination thereof.

A portion of the bottom package encapsulant 560 can protrude into the cavity 530 to provide a lower height or profile of the integrated circuit package system 500. The package connectors 534 can be connected to the bottom package substrate 556 thereby providing electrical connectivity through the bottom package substrate 556 and the bottom package connectors 562 to the next level system.

Figure 6:
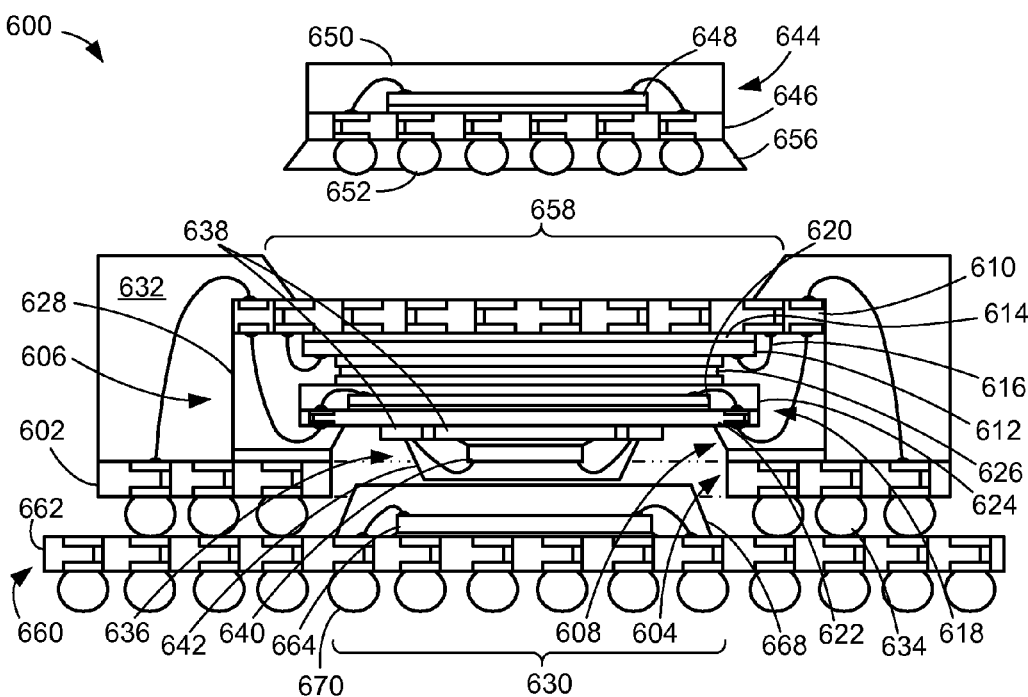
FIG. 6 is a cross-sectional view of an integrated circuit package system in a package attachment phase of a fifth embodiment of the present invention.

Referring now to FIG. 6, therein is shown a cross-sectional view of an integrated circuit package system 600 in a package attachment phase of a fifth embodiment of the present invention. The integrated circuit package system 600 preferably includes a package substrate 602 having a package substrate opening 604. A base package 606 such as an encapsulant cavity package having a base package cavity 608 can be attached or mounted over the package substrate 602.

The base package 606 can preferably include a first package substrate 610 whereon a first package die 612 can be attached or mounted with an attach layer 614. The attach layer 614 can be formed of a material such as an adhesive, epoxy, film, or combination thereof. Further the attach layer 614 provides adhesion, positioning, or structural integrity as well as conductivity or isolation. The attach layer 614 can be formed over any component and include a same material, a different material, or combination thereof.

The first package die 612 can be electrically connected to the first package substrate 610 with connectors 616 such as bond wires, planar interconnect, tab bonds, any conductor, or combination thereof. The connectors 616 can provide electrical connectivity for any component or combination of components including die or substrates.

A base inner package 618 or internal stack module can preferably include a second package die 620 attached or mounted with the attach layer 614 over a second package substrate 622 such as an interposer or multi-layer substrate. The second package die 620 can be electrically connected to the second package substrate 622 with the connectors 616. A base inner package encapsulant 624 can be formed over the second package die 620, the second package substrate 622, and the connectors 616.

The base inner package encapsulant 624 or internal stack module can be attached or mounted over the first package die 612, providing a side of the second package substrate 622 opposite the second package die 620 substantially exposed. Optionally a spacer 626 can be mounted over the first package die 612 with the attach layer 614 whereover the base inner package 618 or internal stack module can be attached or mounted with the attach layer 614. The connectors 616 can connect the second package substrate 622 and the first package substrate 610 thereby connecting the second package die 620 with the first package die 612 or a next level system.

A base package encapsulant 628 can be applied over the base inner package 618 or internal stack module, the first package die 612, the first package substrate 610, the connectors 616, or optionally the spacer 626. The base package encapsulant 628 can be formed providing the side of the second package substrate 622 opposite the second package die 620 substantially exposed.

The base package encapsulant 628 can be formed having orthogonal or non-orthogonal sides. For example, while all sides can be formed orthogonally, the base package cavity 608 can be formed having tapered or angled sides wherein the base package cavity 608 can include an opening having planar dimensions greater than planar dimensions of a closed end. The base package cavity 608 can be formed in the base package encapsulant 628 over a portion of the second package substrate 622 for providing the second package substrate 622 substantially exposed for connectivity to other components.

The base package 606 can be attached over the package substrate 602 wherein the base package cavity 608 can be substantially aligned to the package substrate opening 604 to form a lower cavity 630. The lower cavity 630 can be formed by the base package cavity 608, the package substrate opening 604, and the second package substrate 622 of the base package 606. The second package substrate 622 can provide a mounting or contact surface for another device.

A package encapsulant 632 can be applied over the base package 606, and the package substrate 602 having the package substrate opening 604. Package connectors 634 such as solder bumps, solder balls, any conductor, or combination thereof can be formed over the package substrate 602 on a side opposite the base package 606. The package connectors 634 can provide electrically connectivity to a next level system such as another package, a printed circuit board, any subsystem, or combination thereof.

A stack package 636 such as an external quad flat no-lead or land grid array can be mounted over the second package substrate 622 and partially within the lower cavity 630. The stack package 636 can include a stack package base 638 such as a leadframe or multilayer substrate wherein a stack package die 640 can be attached or mounted over the stack package base 638 with the attach layer 614.

The connectors 616 can electrically connect the stack package die 640 and the stack package base 638 thereby connecting the stack package die 640 to the base package 606. A stack package encapsulant 642 can be applied over the stack package die 640, the connectors 616, or the stack package base 638 for protection or structural integrity.

Optionally a top package 644 can be attached or mounted over the first package substrate 610 on a side opposite the first package die 612. The top package 644 can include a top package substrate 646, a top package die 648 such as a flip-chip or wirebond die attached or mounted over the top package substrate 646, a top package encapsulant 650 over the top package die 648 and the top package substrate 646. The top package die 648 over the top package substrate 646 can be attached with the attach layer 614 or electrically connected with the connectors 616.

Top package connectors 652 can be formed over the top package substrate 646 on a side opposite the top package die 648. The top package connectors 652 can provide electrical connectivity to the first package substrate 610 and thereby the package substrate 602.

A fill material 656 such as an underfill can be applied adjacent the top package connectors for protection or structural integrity. The fill material 656 can provide improved attachment or mounting over an upper cavity 658. The upper cavity 658 can be formed in the package encapsulant 632 over the first package substrate 610 on a side opposite the first package die 612.

The package encapsulant 632 can be formed having orthogonal or non-orthogonal sides. For example, while all sides can be formed orthogonally, the upper cavity 658 can be formed having tapered or angled sides of the upper cavity 658 having an opening with planar dimensions greater than planar dimensions of a closed end near the first package substrate 610.

The package substrate 602 having the package connectors 634 can be attached or mounted over a bottom package 660 having a bottom package substrate 662, a bottom package die 664, a bottom package encapsulant 668, and bottom package connectors 670. The bottom package die 664 over the bottom package substrate 662 can be attached or mounted with the attach layer 614 and can be electrically connected with the connectors 616.

The bottom package encapsulant 668 can be applied over the bottom package die 664, the connectors 616, and the bottom package substrate 662 for protection or structural integrity. The bottom package connectors 670 can be formed over the bottom package substrate 662 on a side opposite the bottom package die 664 for electrically connectivity to a next level system such as another package, a printed circuit board, any subsystem, or combination thereof.

A portion of the bottom package encapsulant 668 can protrude into the lower cavity 630 to provide a lower height or profile of the integrated circuit package system 600. The package connectors 634 can be connected to the bottom package substrate 662 thereby providing electrical connectivity through the bottom package substrate 662 and the bottom package connectors 670 to the next level system.

It has been discovered that the integrated circuit package system 600 with the lower cavity 630 and the upper cavity 658 allows further stacking of another package such as the stack package 636 over a bottom side of the base package 606 and the top package 644 over a top side of the first package substrate 610.

Figure 7:
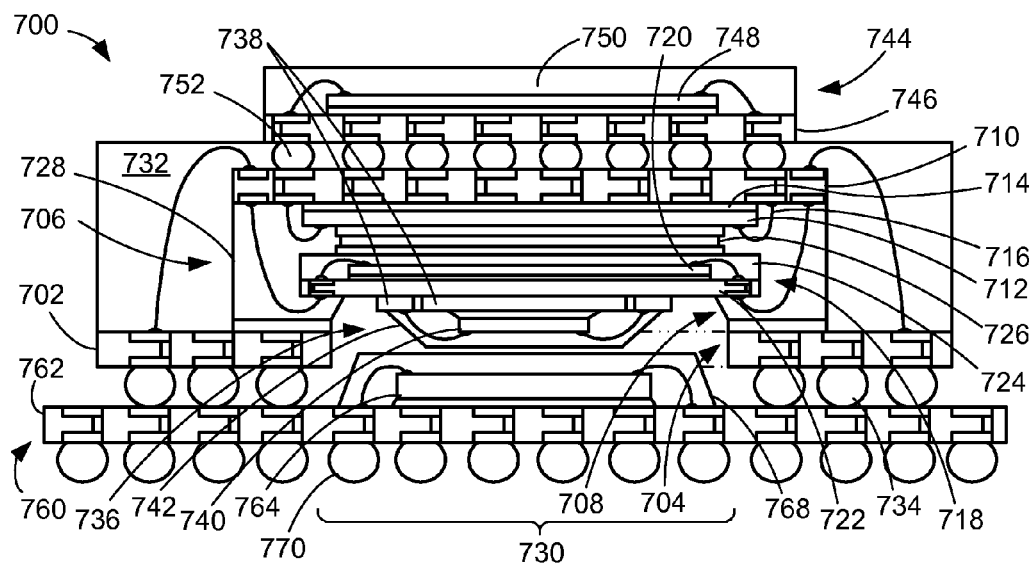
FIG. 7 is a cross-sectional view of an integrated circuit package system in a sixth embodiment of the present invention.

Referring now to FIG. 7, therein is shown a cross-sectional view of an integrated circuit package system 700 in a sixth embodiment of the present invention. The integrated circuit package system 700 preferably includes a package substrate 702 having a package substrate opening 704. A base package 706 such as an encapsulant cavity package having a base package cavity 708 can be attached or mounted over the package substrate 702.

The base package 706 can preferably include a first package substrate 710 whereon a first package die 712 can be attached or mounted with an attach layer 714. The attach layer 714 can be formed of a material such as an adhesive, epoxy, film, or combination thereof. Further the attach layer 714 provides adhesion, positioning, or structural integrity as well as conductivity or isolation. The attach layer 714 can be formed over any component and include a same material, a different material, or combination thereof.

The first package die 712 can be electrically connected to the first package substrate 710 with connectors 716 such as bond wires, planar interconnect, tab bonds, any conductor, or combination thereof. The connectors 716 can provide electrical connectivity for any component or combination of components including die or substrates.

A base inner package 718 or internal stack module can preferably include a second package die 720 attached or mounted with the attach layer 714 over a second package substrate 722 such as an interposer or multi-layer substrate. The second package die 720 can be electrically connected to the second package substrate 722 with the connectors 716. A base inner package encapsulant 724 can be formed over the second package die 720, the second package substrate 722, and the connectors 716.

The base inner package encapsulant 724 can be attached or mounted over the first package die 712, providing a side of the second package substrate 722 opposite the second package die 720 substantially exposed. Optionally a spacer 726 can be mounted over the first package die 712 with the attach layer 714 whereover the base inner package 718 or internal stack module can be attached or mounted with the attach layer 714. The connectors 716 can connect the second package substrate 722 and the first package substrate 710 thereby connecting the second package die 720 with the first package die 712 or a next level system.

A base package encapsulant 728 can be applied over the base inner package 718 or internal stack module, the first package die 712, the first package substrate 710, the connectors 716, or optionally the spacer 726. The base package encapsulant 728 can be formed providing the side of the second package substrate 722 opposite the second package die 720 substantially exposed.

The base package encapsulant 728 can be formed having orthogonal or non-orthogonal sides. For example, while all sides can be formed orthogonally, the base package cavity 708 can be formed having tapered or angled sides of the base package cavity 708 having an opening with planar dimensions greater than planar dimensions of a closed end. The base package cavity 708 can be formed in the base package encapsulant 728 over a portion of the second package substrate 722 for providing the second package substrate 722 substantially exposed for connectivity to other components.

The base package 706 can be attached over the package substrate 702 wherein the base package cavity 708 can be substantially aligned to the package substrate opening 704 to form a lower cavity 730. The lower cavity 730 can be formed by the base package cavity 708, the package substrate opening 704, and the second package substrate 722 of the base package 706. The second package substrate 722 can provide a mounting or contact surface for another device.

A package encapsulant 732 can be applied over the base package 706, and the package substrate 702 having the package substrate opening 704. Package connectors 734 such as solder bumps, solder balls, any conductor, or combination thereof can be formed over the package substrate 702 on a side opposite the base package 706. The package connectors 734 can provide electrically connectivity to a next level system such as another package, a printed circuit board, any subsystem, or combination thereof.

A stack package 736 such as an external quad flat no-lead or land grid array can be mounted over the second package substrate 722 and partially within the lower cavity 730. The stack package 736 can include a stack package base 738 such as a leadframe or multilayer substrate wherein a stack package die 740 can be attached or mounted over the stack package base 738 with the attach layer 714.

The connectors 716 can electrically connect the stack package die 740 and the stack package base 738 thereby connecting the stack package die 740 to the base package 706. A stack package encapsulant 742 can be applied over the stack package die 740, the connectors 716, or the stack package base 738 for protection or structural integrity.

Optionally a top package 744 can be attached or mounted over the first package substrate 710 on a side opposite the first package die 712. The top package 744 can include a top package substrate 746, a top package die 748 such as a flip-chip or wirebond die attached or mounted over the top package substrate 746, a top package encapsulant 750 over the top package die 748 and the top package substrate 746. The top package die 748 over the top package substrate 746 can be attached with the attach layer 714 or electrically connected with the connectors 716.

Top package connectors 752 can be formed over the top package substrate 746 on a side opposite the top package die 748. The top package connectors 752 can provide electrical connectivity to the first package substrate 710 and thereby the package substrate 702. The package encapsulant 732 can be formed over the top package connectors 752 in a configuration such as embedded solder-on-pad.

The package substrate 702 having the package connectors 734 can be attached or mounted over a bottom package 760 having a bottom package substrate 762, a bottom package die 764, a bottom package encapsulant 768, and bottom package connectors 770. The bottom package die 764 over the bottom package substrate 762 can be attached or mounted with the attach layer 714 and can be electrically connected with the connectors 716.

The bottom package encapsulant 768 can be applied over the bottom package die 764, the connectors 716, and the bottom package substrate 762 for protection or structural integrity. The bottom package connectors 770 can be formed over the bottom package substrate 762 on a side opposite the bottom package die 764 for electrically connectivity to a next level system such as another package, a printed circuit board, any subsystem, or combination thereof.

A portion of the bottom package encapsulant 768 can protrude into the lower cavity 730 to provide a lower height or profile of the integrated circuit package system 700. The package connectors 734 can be connected to the bottom package substrate 762 thereby providing electrical connectivity through the bottom package substrate 762 and the bottom package connectors 770 to the next level system.

Figure 8:
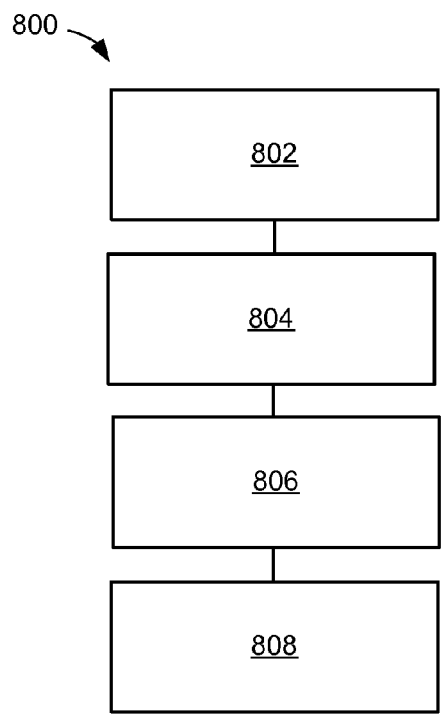
FIG. 8 is a flow chart of an integrated circuit package system for manufacturing the integrated circuit package system in an embodiment of the present invention.

Referring now to FIG. 8, therein is shown a flow chart of an integrated circuit package system 800 for manufacturing the integrated circuit package system 100 in an embodiment of the present invention. The system 800 includes providing a package substrate in a block 802; attaching a base package over the package substrate in a block 804; forming a cavity in the package substrate and the base package having a portion of the base package substantially exposed in a block 806; and attaching a device partially in the cavity and connected to the base package in a block 808.

In greater detail, a system to provide the method and apparatus of the integrated circuit package system 100, in an embodiment of the present invention, is performed as follows:

1. Forming a package substrate having a package substrate opening.
2. Mounting a base package having a base package cavity and a second package substrate wherein a portion of the second package substrate is substantially exposed over the package substrate.
3. Forming a cavity through the package substrate to the base package wherein the base package cavity is substantially aligned to the package substrate opening.
4. Mounting a device partially within the cavity and connected to the substantially exposed portion of the second package substrate.

Thus, it has been discovered that the integrated circuit package system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   providing a package substrate having a package opening;
   providing a base package having a base package cavity;
   electrically connecting the base package to the package substrate with the base package cavity over the package opening; and
   attaching a device partially in the package opening and partially in the base package cavity and connected to the portion of the base package substantially exposed.

2. The system as claimed in claim 1 wherein providing a base package having a base package cavity includes attaching the base package over the package substrate wherein a base package cavity of the base package is over the package opening of the package substrate.

3. The system as claimed in claim 1 wherein providing a base package having a base package cavity includes providing the base package having the base package cavity over a second package substrate of the base package.

4. The system as claimed in claim 1 further comprising attaching a top package over the base package.

5. The system as claimed in claim 1 further comprising forming an upper cavity in a package encapsulant over a first package substrate of the base package.

6. An integrated circuit package system comprising:
   forming a package substrate having a package substrate opening;
   mounting a base package having a base package cavity and a second package substrate wherein a portion of the second package substrate is substantially exposed over the package substrate;
   electrically connecting the base package to the package substrate wherein the base package cavity is substantially aligned to the package substrate opening; and
   mounting a device partially within the package opening and connected to the substantially exposed portion of the second package substrate.

7. The system as claimed in claim 6 wherein attaching the device includes attaching a stack package.

8. The system as claimed in claim 6 wherein attaching the device includes attaching a passive component.

9. The system as claimed in claim 6 further comprising attaching a bottom package over the cavity.

10. The system as claimed in claim 6 further comprising attaching an interposer over the cavity.

11. The system as claimed in claim 6 further comprising attaching a top package over the base package with embedded solder-on-pad.

12. An integrated circuit package system comprising:
a package substrate having a package opening;
a base package having a base package cavity;
the base package electrically connected to the package substrate with the base package cavity over the package opening; and
a device partially in the package opening and partially in the base package cavity and connected to the portion of the base package substantially exposed.

13. The system as claimed in claim 12 wherein the base package cavity includes the base package over the package substrate wherein a base package cavity of the base package is over a package opening of the package substrate.

14. The system as claimed in claim 12 wherein the base package cavity is over a second package substrate of the base package.

15. The system as claimed in claim 12 further comprising a top package over the base package.

16. The system as claimed in claim 12 further comprising an upper cavity in a package encapsulant over a first package substrate of the base package.

17. The system as claimed in claim 12 wherein:
the package substrate is the package substrate having a package substrate opening;
the base package is the base package having a base package cavity and a second package substrate wherein a portion of the second package substrate is substantially exposed over the package substrate;
the cavity is the cavity through the package substrate to the base package wherein the base package cavity is substantially aligned to the package substrate opening; and
the device is the device partially within the cavity and connected to the substantially exposed portion of the second package substrate.

18. The system as claimed in claim 17 wherein the device is a stack package.

19. The system as claimed in claim 17 wherein the device is a passive component.

20. The system as claimed in claim 17 further comprising a bottom package over the cavity.

21. The system as claimed in claim 17 further comprising an interposer over the cavity.

22. The system as claimed in claim 17 further comprising a top package over the base package with embedded solder-on-pad.

* * * * *